(12) United States Patent
Booth, Jr. et al.

(10) Patent No.: US 8,629,009 B2
(45) Date of Patent: Jan. 14, 2014

(54) PROGRAMMABLE HIGH-K/METAL GATE MEMORY DEVICE

(75) Inventors: Roger A. Booth, Jr., Wappingers Falls, NY (US); Kangguo Cheng, Guilderland, NY (US); Chandrasekharan Kothandaraman, Hopewell Junction, NY (US); Chengwen Pei, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/433,423

(22) Filed: Mar. 29, 2012

(65) Prior Publication Data
US 2012/0184073 A1    Jul. 19, 2012

Related U.S. Application Data

(62) Division of application No. 12/355,954, filed on Jan. 19, 2009, now Pat. No. 8,525,263.

(51) Int. Cl.
*H01L 21/336*    (2006.01)

(52) U.S. Cl.
USPC .......... 438/157; 438/283; 257/311; 257/328; 257/350; 257/E21.409; 257/E27.103

(58) Field of Classification Search
USPC .......... 257/311, 328, 350, E27.103; 438/157, 438/283
See application file for complete search history.

(56) References Cited

U.S. PATENT DOCUMENTS

| | | | |
|---|---|---|---|
| 6,717,206 B2 | 4/2004 | Hsu et al. | |
| 6,730,957 B1 | 5/2004 | Jang | |
| 6,838,396 B2 | 1/2005 | Burnham et al. | |
| 7,112,490 B1 | 9/2006 | Hong et al. | |
| 7,118,954 B1 | 10/2006 | Lin et al. | |
| 7,250,340 B2 | 7/2007 | Swift et al. | |
| 2004/0007732 A1 | 1/2004 | Wong et al. | |
| 2004/0007747 A1 | 1/2004 | Visokay et al. | |
| 2004/0087096 A1 | 5/2004 | Jang | |
| 2005/0194648 A1 | 9/2005 | Kim et al. | |
| 2005/0269635 A1* | 12/2005 | Bojarczuk et al. | 257/338 |
| 2008/0076214 A1* | 3/2008 | Han et al. | 438/197 |

OTHER PUBLICATIONS

U.S. Office Action dated Sep. 18, 2012 in related U.S. Appl. No. 13/433,423.
U.S. Final Office Action dated May 24, 2012 received in a related application U.S. Appl. No. 12/355,954.
PCT/EP2009/067671—Filed Dec. 21, 2009—International Search Report and Written Opinion.

* cited by examiner

*Primary Examiner* — Ori Nadav
*Assistant Examiner* — Vernon P Webb
(74) *Attorney, Agent, or Firm* — Scully, Scott, Murphy & Presser, P.C.; Joseph P. Abate, Esq.

(57) ABSTRACT

A method of fabricating a memory device is provided that may begin with forming a layered gate stack atop a semiconductor substrate and patterning a metal electrode layer stopping on the high-k gate dielectric layer of the layered gate stack to provide a first metal gate electrode and a second metal gate electrode on the semiconductor substrate. In a next process sequence, at least one spacer is formed on the first metal gate electrode atop a portion of the high-k gate dielectric layer, wherein a remaining portion of the high-k gate dielectric is exposed. The remaining portion of the high-k gate dielectric layer is etched to provide a first high-k gate dielectric having a portion that extends beyond a sidewall of the first metal gate electrode and a second high-k gate dielectric having an edge that is aligned to a sidewall of the second metal gate electrode.

19 Claims, 6 Drawing Sheets

PROGRAMMABLE HIGH-K/METAL GATE MEMORY DEVICE

CROSS REFERENCE TO RELATED APPLICATION

This application is a divisional of U.S. patent application Ser. No. 12/355,954 filed Jan. 19, 2009 the entire content and disclosure of which is incorporated herein by reference.

FIELD OF THE INVENTION

The present invention in one embodiment relates to semiconductor structures having high-k gate dielectrics and gate electrodes composed of a metal.

BACKGROUND

Programmable memory is being widely used in various electronic applications, such as one-time programmable fuses, field-programmable gate array (FPGA) devices, and programmable logic arrays (PLA). One commonly used programmable memory type is a metal oxide semiconductor field effect transistor (MOSFET) based on hot-carrier effects, in which a high electrical field in the channel of the MOSFET generates hot carriers, which produce electron-hole pairs through impact ionization. Electrons are injected and trapped in the spacer and holes are collected by the substrate. Depending on whether electrons are trapped in the spacer or not, a logic value of "0" or "1" is produced.

SUMMARY OF THE INVENTION

A method is provided for integrating programmable memory MOSFETs with logic MOSFETs. Broadly, the method includes providing a semiconductor substrate including a first portion and a second portion; forming a layered gate stack atop the semiconductor substrate, the layered gate stack including a high-k gate dielectric layer atop the semiconductor substrate and a metal electrode layer atop the high-k gate dielectric layer; patterning the metal electrode layer stopping on the high-k gate dielectric layer to provide a first metal gate electrode present in the first portion of the semiconductor substrate, and a second metal gate electrode present in the second portion of the semiconductor substrate; forming a spacer on the first metal gate electrode atop a portion of the high-k gate dielectric layer, wherein a remaining portion of the high-k gate dielectric that is not beneath the first metal gate electrode, the second metal gate electrode, and the portion of the high-k gate dielectric that is beneath the spacer is exposed; and etching the remaining portion of the high-k gate dielectric layer to provide a first high-k gate dielectric having a portion that extends beyond a sidewall of the first metal gate electrode and a second high-k gate dielectric having an edge that is aligned to a sidewall of the second metal gate electrode.

In another aspect, a memory device is provided that includes programmable memory MOSFETs and conventional MOSFETs. Broadly, the memory device includes a semiconductor substrate including a first portion and a second portion; a programmable memory device present in the first portion of the semiconductor substrate including a first gate structure and spacers abutting the first gate structure, the first gate structure including a first metal gate electrode atop a first high-k gate dielectric, wherein a portion of the first high-k gate dielectric is present beneath the spacers; and a semiconductor device present in the second portion of the semiconductor substrate, the semiconductor device including a second gate structure, the second gate structure including a second metal gate electrode atop a second high-k gate dielectric, wherein a sidewall of the second metal gate electrode is aligned to an edge of the second high-k gate dielectric.

In another aspect, a memory device is provided that includes a gate structure and spacers abutting the gate structure, the gate structure including a metal gate electrode atop a high-k gate dielectric, wherein a portion of the high-k gate dielectric is present beneath the spacers abutting the gate structure.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIGS. 9-12 depict another embodiment of the present invention that begins with the structure depicted in FIG. 3, wherein

The above drawings represent some embodiments of the present invention, which are provided for illustrative purposes only are not intended to limit the scope of the invention solely thereto.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and structures relating to gate structures in semiconductor and memory devices. When describing the inventive methods and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, the term "memory device" means a structure in which the electrical state thereof can be altered and then retained in the altered state; in this way a bit of information can be stored.

As used herein a "field effect transistor" is a transistor in which output current, i.e., source-drain current, is controlled by the voltage applied to a gate structure. A field effect transistor has three terminals, i.e., gate structure, source region and drain region.

As used herein, the term "device channel" is the region beneath the gate structure and between the source region and drain region that becomes conductive when the semiconductor device is turned on.

As used herein, the term "drain region" means a doped region in a semiconductor device located at the end of the device channel from which carriers are flowing out of the semiconductor device through the drain region.

As used herein, the term "source region" is a doped region in a semiconductor device from which majority carriers are flowing into the device channel.

A "gate structure" means a structure used to control output current (i.e., flow of carriers in the channel) of a semiconductor device, such as a field effect transistor (FET).

As used herein, the term "gate electrode" denotes a material having a conductivity ranging from 0.1 Ω/square to 500 Ω/square, which is positioned atop a gate dielectric.

As used herein, a "gate dielectric" is a layer of an insulator between the semiconductor substrate and the gate electrode. (use very thin metal, so we typically see 300 ohms/sq).

As used herein, "high k" denotes a dielectric material featuring a dielectric constant (k) higher than about 3.9.

As used herein, a "metal" is an electrically conductive material, in which the metal atoms are held together by the force of a metallic bond, and the energy band structure of the metal's conduction and valence bands overlap, and hence, there is no energy gap.

As used herein, the term "selective" in reference to a material removal processes denotes that the rate of material removal for a first material is greater than the rate of at least another material of the structure to which the material removal process is being applied. In one embodiment, selective etching denotes an etch selectivity of 2:1 or greater.

As used herein, "dopant regions" refers to portions of an intrinsic semiconductor material in which the electrical conductivity of the material is dependent upon n-type or p-type dopants.

The term "anisotropic" denotes a material removal process in which the material removal rate in the direction normal to the surface of the material to which the etching species is being applied is greater than in the direction parallel to the surface of the material to be removed.

As used herein, "insulating" or "dielectric" denotes a material having a room temperature conductivity of less than about $10^{-10}$ $(\Omega\text{-m})^{-1}$.

The terms "direct physical contact" or "abutting" mean that the two structures are in contact without any intermediary conducting, insulating or semiconducting structures.

The terms "atop", "beneath", "atop", and "on" define a structural relationship in which two structures are in contact where an intermediary structure of a conducting, insulating, or semiconducting material may or may not be present at the interface of the two structures.

For purposes of the description hereinafter, the terms "upper", "lower", "right", "left", "vertical", "horizontal", "top", "bottom", and derivatives thereof shall relate to the invention, as it is oriented in the drawing figures.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

A variety of applications, such as system-on-chip, require forming programmable memory MOSFETs and logic MOSFETs, i.e., MOSFETs not configured for memory applications, on the same chip. However, a programmable memory field effect transistor (FET) and a logic MOSFET have different and often competing requirements. For example, in programmable memory MOSFETs, it is desired to enhance charge trapping and thus to improve the program efficiency. In contrast, in logic MOSFETs, it is desired to suppress the charge trapping and thus to minimize shift of device characteristics.

In one embodiment, the present invention provides methods and structures for forming a high-k metal gate programmable memory metal oxide semiconductor field effect transistor (MOSFET), and a semiconductor device, such as a logic MOSFET, on the same semiconductor substrate. The programmable memory MOSFET may be configured to enhance the efficiency of electron trapping in the spacer of the device, and the semiconductor device may be configured to reduce hot carrier effects.

Figure 1:
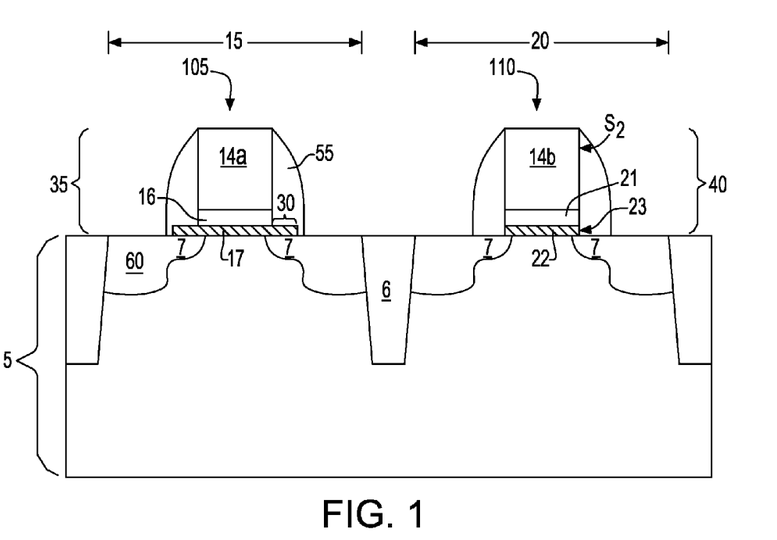
FIG. 1 is a side cross-sectional view of a memory device, in accordance with one embodiment of the present invention.

FIG. 1 depicts one embodiment of a memory device, in accordance with the present invention. The memory device may include a semiconductor substrate 5 including a first portion 15 and a second portion 20, in which a programmable memory device 105 is present in the first portion 15 and a semiconductor device 110 is present in the second portion 20. The programmable memory device 105 may include a first gate structure 35 and at least one spacer 55 abutting the first gate structure 35. The first gate structure 35 may include a first metal gate electrode 16 atop a first high-k gate dielectric 17, wherein a portion 30 of the first high-k gate dielectric 17 is present beneath the at least one spacer 55 abutting the first gate structure 35. The semiconductor device 110 may include a second gate structure 40 composed of a second metal gate electrode 21 atop a second high-k gate dielectric 22, wherein a sidewall $S_2$ of the second metal gate electrode 21 is aligned to an edge 23 of the second high-k gate dielectric 22.

In one embodiment, the portion 30 of the first high-k gate dielectric 17 that is present beneath the at least one spacer 55 abutting the first gate structure 35 facilitates electron and hole trapping in the memory function of the programmable memory device 105, and the sidewall $S_2$ of the second metal gate electrode 21 that is aligned to the edge 23 of the second high-k gate dielectric 22 reduces hot carrier effects in the semiconductor device 110.

The first gate structure 35 may further include a first polysilicon layer 14a atop the first metal gate electrode 16, and the second gate structure 40 may further include a second polysilicon layer 14b atop the second metal gate electrode 21. In some embodiments, the polysilicon layers 14a and 14b are omitted. The programmable memory device 105 and the semiconductor device 110 may further include extension source and drain regions 7 and deep source and drain regions 60, as depicted in FIG. 1. The above described memory device and the methods for forming memory devices are now described in greater detail referring to FIGS. 2-12.

Figure 2:
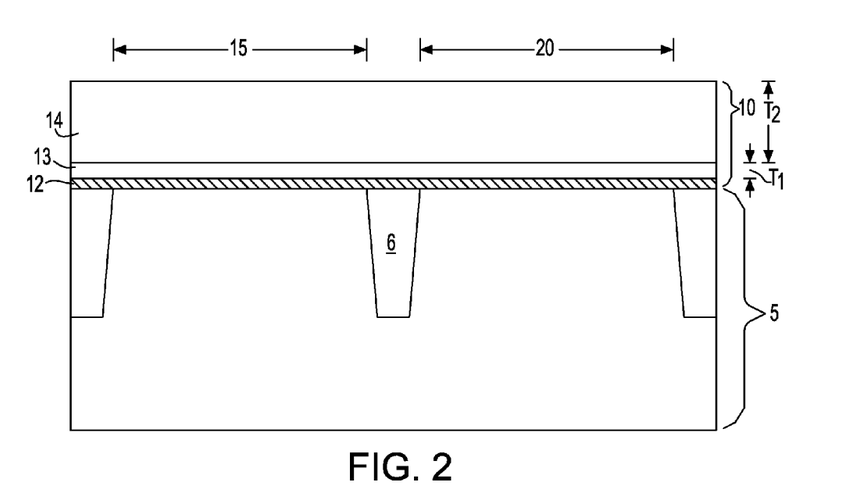
FIG. 2 is a side cross-sectional view of an initial structure including a layered gate stack atop a semiconductor substrate, the layered gate stack including a high-k gate dielectric layer atop the semiconductor substrate and a metal electrode layer atop the high-k gate dielectric layer.

FIG. 2 depicts an initial structure for use in one embodiment of the present invention. The initial structure may include a layered gate stack 10 atop a semiconductor substrate 5. The layered gate stack 10 may include a high-k gate dielectric layer 12 atop the semiconductor substrate 5 and a metal electrode layer 13 atop the high-k gate dielectric layer 12. Typically, the layered gate stack 10 further includes a polysilicon layer 14 atop the metal electrode layer 13.

The semiconductor substrate 5 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. When the semiconductor substrate 5 is a silicon-on-insulator (SOI) or SiGe-on-insulator (SGOI) substrate, the thickness of the Si-containing layer atop the buried insulating layer can have a thickness on the order of 30 nm or greater. The SOI or SGOI substrate may be fabricated using techniques that are well known to those skilled in the art. For example, the SOI or SGOI substrate may be fabricated using a thermal bonding process, or alternatively be fabricated by an ion implantation process, which is referred to in the art as separation by ion implantation of oxygen (SIMOX).

An isolation region 6 may be formed in the semiconductor substrate 5, wherein the isolation region 6 separates a first portion 15 of the semiconductor substrate 5 from a second portion 20 of the semiconductor substrate 5. The isolation region 6 may be a shallow trench isolation (STI). The STI regions may be formed by etching a trench in the semiconductor substrate 5 utilizing a conventional dry etching process, such as reactive-ion etching (RIE) or plasma etching. The trenches may optionally be lined with a conventional liner material, e.g., an oxide, and then chemical vapor deposition (CVD) or another like deposition process is used to fill the trench with polysilicon or another like STI dielectric material such as oxide and/or nitride. The STI dielectric may optionally be densified after deposition. A conventional planarization process, such as chemical-mechanical polishing (CMP), may optionally be used to provide a planar structure. In some embodiments, the isolation region is a LOCOS (Local Oxidation of Silicon) region formed by a conventional local oxidation of silicon process.

Still referring to FIG. 2, the high-k gate dielectric layer 12 is formed atop the semiconductor substrate 5, and is typically an oxide-containing material and is generally greater than about 0.8 nm thick. The high-k gate dielectric layer 12 is more typically from 1.0 nm to 2.0 nm thick, although lesser and greater thickness are also contemplated herein.

The high-k gate dielectric layer 12 may be a single layer or more typically include multiple layers of materials. For example, the high-k gate dielectric layer 12 may include an interfacial layer (typically silicon oxide, silicon nitride, or silicon oxynitride) and a high-k material with a dielectric constant greater than 7. The high-k gate dielectric layer 12 may also be composed of one or more materials, including but not limited to, silicon oxide, silicon nitride, silicon oxynitride, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, an any combination of these materials.

The high-k gate dielectric layer 12 may be formed using deposition techniques including, but not limited to: chemical vapor deposition (CVD), atomic layer CVD (ALCVD), pulsed CVD, plasma assisted CVD, sputtering, and chemical solution deposition. In another example, the high-k gate dielectric layer 12 further includes an interfacial layer, which may be formed by oxidation, oxynitridation, nitridation, chemical oxidation, and/or plasma or radical treatment. It is noted that the high-k gate dielectric layer 12 is subsequently etched to form the first high-k gate dielectric of the first gate structure and the second high-k gate dielectric of the second gate structure.

The metal electrode layer 13 is formed atop the high-k gate dielectric layer 12 utilizing a deposition process, such as CVD, plasma-assisted CVD, plating, and/or sputtering, followed by planarization. The metal electrode layer 13 may include any conductive metal including, but not limited to: W, Ni, Ti, Mo, Ta, Cu, Pt, Ag, Au, Ru, Ir, Rh, and Re, and alloys that include at least one of the aforementioned conductive elemental metals. When a combination of conductive elements is employed, an optional diffusion barrier material (not shown in the drawing) such as TaN or WN may be formed between the conductive materials. The metal electrode layer 13 may have a thickness $T_1$ ranging from 5 nm to 50 nm. More typically, the thickness $T_1$ of the metal electrode layer 13 ranges from 7.5 nm to 20 nm. It is noted that the metal electrode layer 13 is subsequently etched to form the first metal gate electrode of the first gate structure and the second metal gate electrode of the second gate structure.

Still referring to FIG. 2, the polysilicon layer 14 may be deposited by chemical vapor deposition (CVD). The polysilicon layer 14 can be doped with elements from group III-A or group V of the Periodic Table of Elements. The dopants may be introduced during deposition of the polysilicon layer 14 or following subsequent formation of the gate structure 10. The polysilicon layer 14 may have a thickness $T_2$ ranging from 20 nm to 200 nm. More typically, the thickness $T_2$ of the polysilicon layer 14 ranges from 40 nm to 80 nm. It is again emphasized that in some embodiments of the present invention the polysilicon layer 14 may be omitted. It is noted that the polysilicon layer 14 is subsequently etched to form the first polysilicon layer of the first gate structure and the second polysilicon layer of the second gate structure.

Figure 3:
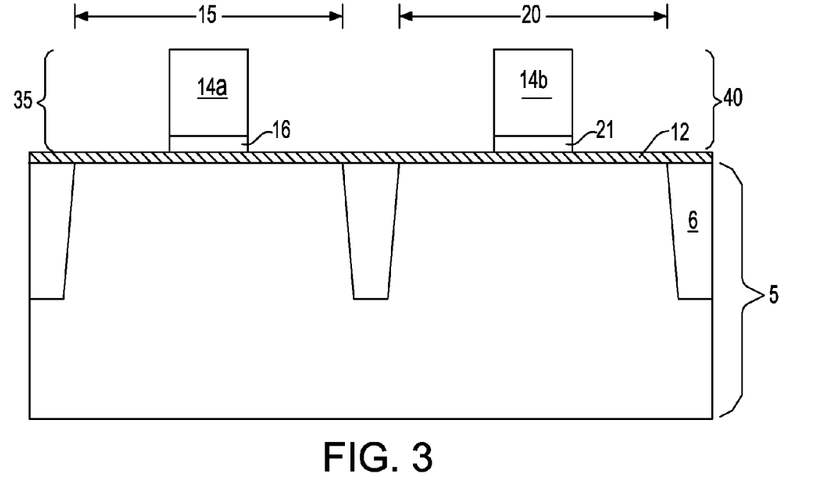
FIG. 3 is a side cross-sectional view of patterning the metal electrode layer stopping on the high-k gate dielectric layer to provide a first metal gate electrode present in the first portion of the semiconductor substrate and a second metal gate electrode present in the second portion of the semiconductor substrate.

FIG. 3 depicts patterning the polysilicon layer (when present) and patterning the metal electrode layer stopping on the high-k gate dielectric layer 12 to provide a first metal gate electrode 16 present in the first portion 15 of the semiconductor substrate 20 and a second metal gate electrode 21 present in the second portion 20 of the semiconductor substrate 5. The first metal gate electrode 16 and the second metal gate electrode 21 are formed utilizing photolithography and etch process steps. Specifically, a pattern is produced by applying a masking layer (photoresist or photoresist with an beneath hardmask) to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, the polysilicon layer is etched and then utilized as an etch mask during the etch process that provides the first metal gate electrode 16 and the second metal gate electrode 21. It is noted that the above-described etch process may be utilized to provide the first polysilicon layer 14a and the second polysilicon layer 14b, in the embodiments of the invention in which the first polysilicon layer 14a is present in the first gate structure 35 and the second polysilicon layer 14b is present in the second gate structure 40.

Figure 4:
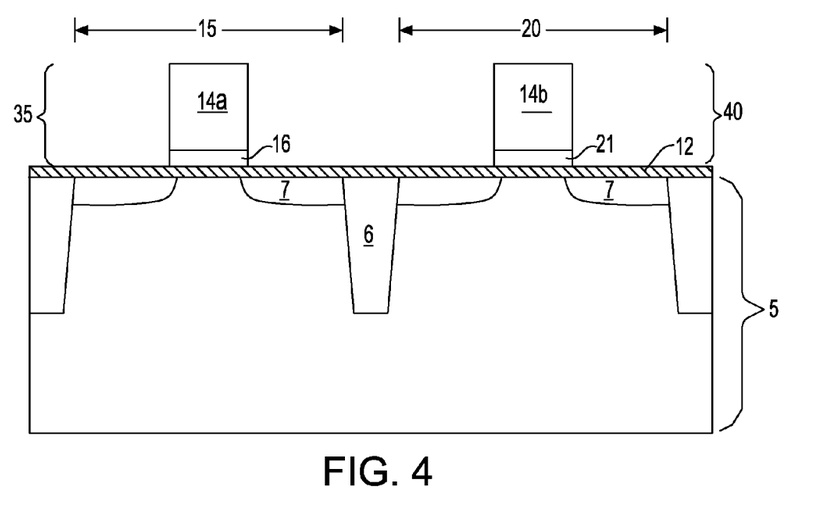
FIG. 4 is a side cross-sectional view depicting forming extension source and drain regions in the first portion and the second portion of the semiconductor substrate.

FIG. 4 depicts forming extension source and drain regions 7 in the first portion 15 and the second portion 20 of the semiconductor substrate 5. The extension source and drain regions 7 may be formed by ion implantation of n-type or p-type dopants into the semiconductor substrate 5. PFET devices are produced within Si-containing semiconductor substrates by doping the source and drain extension regions 7 with elements from group V of the Periodic Table of Elements. NFET devices are produced within Si-containing semiconductor substrates by doping the source and drain extension regions 7 with elements from group V-A of the Periodic Table of Elements. In one example, the dopant for the extension source and drain regions 7 includes arsenic (As), in which the arsenic is implanted at an energy ranging from 2 keV to 50 keV, and the implant concentration ranges from $5 \times 10^{13}$ atoms/cm$^2$ to $1 \times 10^{15}$ atoms/cm$^2$. Halo regions (not shown) can also be formed beneath the source and drain extension regions 7 using an angled ion implantation and a dopant having a conductivity type opposite the source and drain extension regions 7. Optionally, an extension offset spacer, which may include nitride, and is not shown may be formed before forming the extension source and drain regions 7. The extension offset spacer, when present, may be removed after forming the extension source and drain regions 7.

Figure 5:
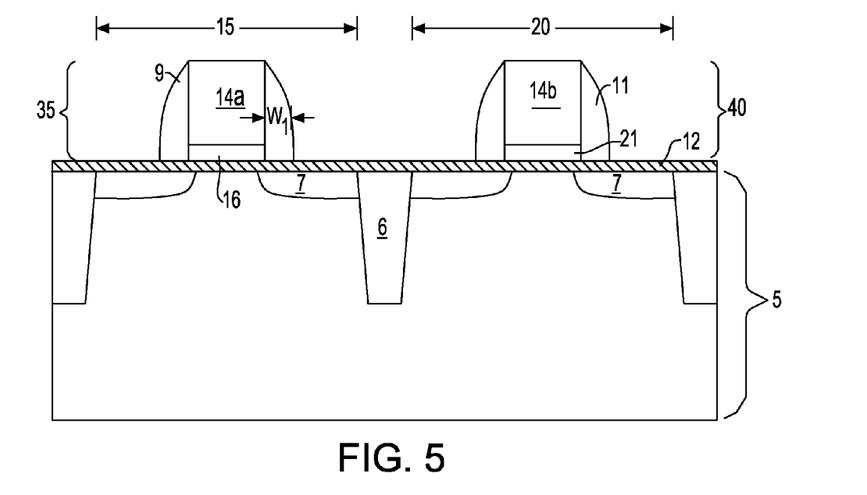
FIG. 5 is a side cross-sectional view depicting forming a first sacrificial spacer on the first metal gate electrode and a second sacrificial spacer on the second metal gate electrode.

FIG. 5 depicts a first sacrificial spacer 9 on the sidewall of the first gate structure 35 including the first metal gate electrode 16 and a second sacrificial spacer 11 on the sidewall of the second gate structure 40 of the second metal gate electrode 21. The first sacrificial spacer 9 and the second sacrificial spacer 11 may be composed of a dielectric material, such as an oxide, nitride, oxynitride or combination thereof. Typically, the first sacrificial spacer 9 and the second sacrificial spacer 11 are composed of a nitride, such as silicon nitride. The first sacrificial spacer 9 and the second sacrificial spacer 11 may be provided by forming processes, such as deposition or thermal growth. For example, the first sacrificial spacer 9 and the second sacrificial spacer 11 may be formed by deposition processes, such as chemical vapor deposition (CVD) in combination with an anisotropic etch, such as reactive ion etch. The first sacrificial spacer 9 and the second sacrificial spacer 11 may each have a width $W_1$ that typically ranges from 5 nm to 60 nm, although lesser and greater thickness have also been contemplated herein. More typically, the first sacrificial spacer 9 and the second sacrificial spacer 11 may each have a width $W_1$ that ranges from 10 nm to 20 nm.

Figure 6:
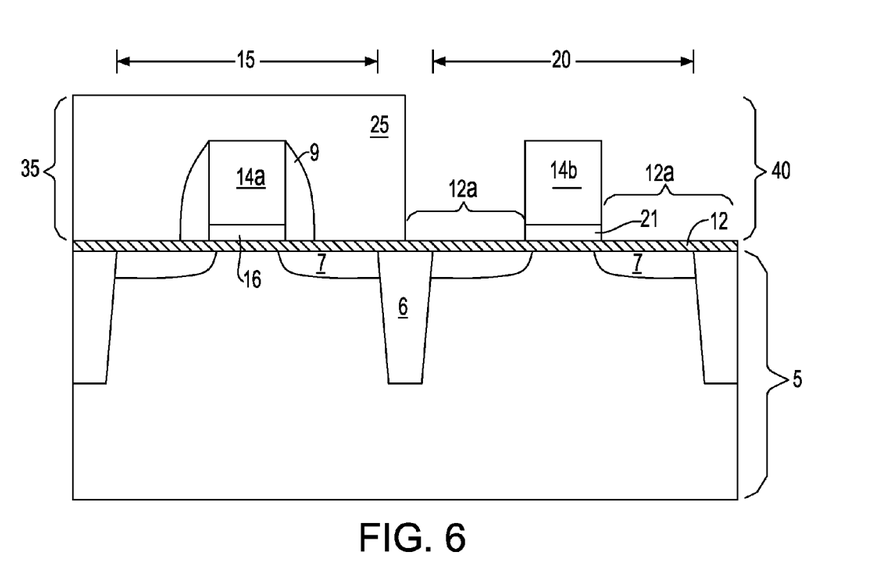
FIG. 6 is a side cross-sectional view depicting removing the second sacrificial spacer from the second metal gate electrode, wherein a remaining portion of the high-k gate dielectric that is not beneath the first metal gate electrode, the second metal gate electrode, and the portion of the high-k gate dielectric that is beneath the first sacrificial spacer is exposed.

FIG. 6 depicts removing the second sacrificial spacer 11 from the second gate structure 40, wherein a remaining portion 12a of the high-k gate dielectric layer 12 that is not beneath the first metal gate electrode 16, the second metal gate electrode 21, and the portion of the high-k gate dielectric layer 12 that is beneath the first sacrificial spacer 9 is exposed. In one embodiment, the exposed portion, i.e., remaining portion 12a, of the high-k gate dielectric layer 12, is selected by forming an etch mask 25 atop and protecting the first portion 15 of the semiconductor substrate 5, in which the first gate structure 30 including the first metal gate electrode 16 and the first sacrificial spacer 9 is present, wherein the etch mask 25 is not atop the portion of the dielectric layer 12 that is present in the second portion 20. Further, as depicted in FIG. 6, the remaining portion 12a of the first dielectric layer 12 that is exposed is not present beneath the second metal gate conductor 21.

In one embodiment, an etch mask 25 is formed atop the first portion 15 of the semiconductor substrate 5. In one embodiment, the etch mask 25 is a hardmask that is formed using deposition, photolithography, and highly selective etching. In one example, a hardmask layer is first deposited atop the first portion 15 and the second portion 20 of the semiconductor substrate 5. The hardmask layer may include dielectric systems that can be deposited by chemical vapor deposition (CVD) and related methods. Typically, hardmask compositions include silicon oxides, silicon carbides, silicon nitrides, silicon carbonitrides, etc. Spin-on dielectrics may also be utilized as the hardmask layer including but are not limited too: silsequioxanes, siloxanes, and boron phosphate silicate glass (BPSG).

The hardmask layer is then patterned using photolithography. Specifically, a pattern is produced by applying a photoresist to the surface to be patterned by exposing the photoresist to a pattern of radiation, wherein the pattern is then developed into the photoresist utilizing a resist developer. Once the patterning of the photoresist is completed, the sections covered by the photoresist are protected, while the exposed regions are removed using a selective etching process that removes the unprotected regions of the hardmask layer forming the etch mask 25.

In another example, a photoresist mask may be used instead of the hardmask for the etch mask 25. The photoresist mask may be provided by applying a photoresist layer, exposing the photoresist to a pattern of radiation, and developing the pattern into the photoresist utilizing a resist developer.

Once the patterning of the photoresist is completed, the sections of the semiconductor substrate 5 covered by the remaining photoresist are protected.

Following the formation of the etch mask 25, the second sacrificial spacer 11 is then removed by an etch process having high selectivity to removing the material of the second sacrificial spacer 11 without substantially etching the etch mask 25, the second metal gate electrode 21, or when present the second polysilicon layer 14b that is positioned atop the second metal gate electrode 21, and the semiconductor substrate 5. Following the removal of the second sacrificial spacer 11, the etch mask 25 may be removed using an etch process, such as selective etching.

Figure 7:
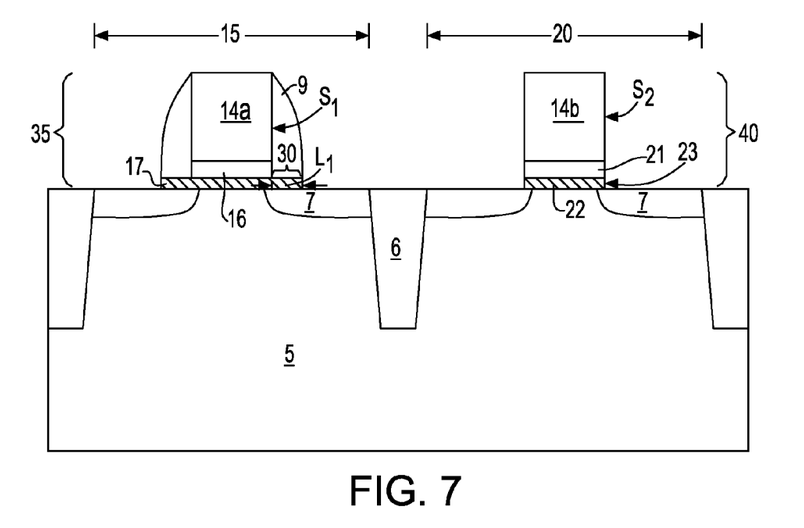
FIG. 7 is a side cross-sectional view depicting etching the remaining portion of the high-k gate dielectric layer to provide a first high-k gate dielectric having a portion that extends beyond a sidewall of the first metal gate electrode and a second high-k gate dielectric having an edge that is aligned to a sidewall of the second metal gate electrode.

FIG. 7 depicts etching the remaining portion, i.e., exposed portion, of the high-k gate dielectric layer after removing the etch mask to provide a first high-k gate dielectric 17 having a portion 30 that extends beyond a sidewall $S_1$ of the first metal gate electrode 16 and a second high-k gate dielectric 22 having an edge 23 that is aligned to a sidewall $S_2$ of the second metal gate electrode 21. The term "aligned" as used to describe the relationship between the edge 23 of the second high-k gate dielectric 22 and the sidewall $S_2$ of the second metal gate electrode 21 means that exterior face of the edge 23 is coplanar, i.e, present on the same plane, with the exterior face of the sidewall $S_2$ of the second metal gate electrode 21. More specifically, in one embodiment, the exterior face of the edge 23 and the exterior face of the sidewall $S_2$ are both present on a plane that is substantially perpendicular to the plane that is parallel to the upper surface of the semiconductor substrate 5.

The remaining portion, i.e., exposed portion, of the high-k gate dielectric layer may be removed by an etch process, such as an anisotropic etch process, e.g., reactive ion etch (RIE). In one embodiment, the etch process is a selective etch process, wherein the etch chemistry removes the material of the high-k gate dielectric layer selective to the semiconductor substrate 5, the first gate structure 35, the second gate structure 40, and the first sacrificial spacer 9.

The portion 30 of the first high-k gate dielectric 17 that is present beneath the first sacrificial spacer 9 abutting the first gate structure 35 has a length L1 ranging from 2 nm to 40 nm, as measured from the sidewall of the first metal gate electrode 16. More typically, the portion of the first high-k gate dielectric 17 that is present beneath the first sacrificial spacer 9 has a length L1 ranging from 5 nm to 20 nm, as measured from the sidewall of the first metal gate electrode 16.

Figure 8:
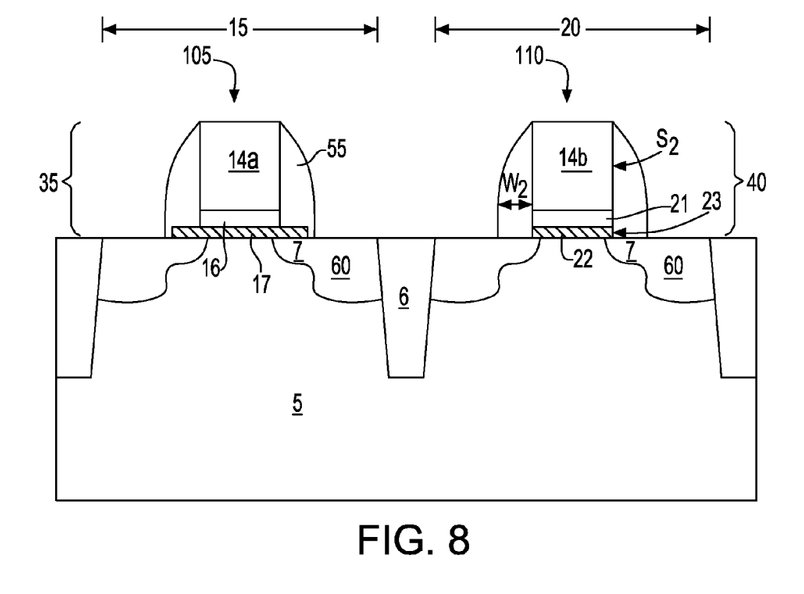
FIG. 8 is a side cross-sectional view depicting forming offset spacers abutting the first metal gate electrode and the second metal gate electrode and forming deep source and drain regions in the first portion and the second portion of the semiconductor substrate.

FIG. 8 depicts forming a deep source and drain offset spacer 55 abutting the first gate structure 35 and the second gate structure 40, and forming deep source and drain regions 60 in the first portion 15 and the second portion 20 of the semiconductor substrate 5. In one embodiment, prior to forming the deep source and drain spacer 55, the first sacrificial spacer 9 is removed from the first gate structure 35 using an etch process. Similar to the first and second sacrificial spacers 9, 11, the deep source and drain spacer 55 may be composed of a dielectric material. The deep source and drain spacer 55 is typically composed of a nitride or a combination of oxide and nitride materials. In one example, the deep source and drain spacer 55 includes a nitride, such as $Si_3N_4$. The deep source and drain spacer 55 may be formed using deposition and etch processes. The deep source and drain spacer 55 may have a spacer width W2 ranging from 10 nm to 60 nm, typically being about 15 nm.

Following deep source and drain spacer 55 formation, a higher energy ion implant is conducted to form deep source and drain regions 60. These implants are conducted at a higher energy and higher concentration of dopant than the source and drain extension region 7 implant. The deep source and drain regions 60 are typically doped with a dopant type consistent with the source and drain extension regions 7.

Following deep source and drain regions 60 formation, the source and drain regions 60 are activated by activation annealing using conventional processes such as, but not limited to: rapid thermal annealing, furnace annealing, flash-lamp annealing, laser annealing, or any combination of those processes. Activation anneal is conducted at a temperature ranging from 850° C. to 1350° C.

Still referring to FIG. 8, in one embodiment, the memory device of the present invention includes a programmable memory device 105 that is present in the first portion 15 of the semiconductor substrate 5 and a semiconductor device 110 that is present in the second portion 20 of the semiconductor substrate 5.

In one embodiment, the programmable memory device 105 is a hot carrier memory field effect transistor (FET). The programmable memory device 105 may include a first gate structure 35 and at least one spacer, i.e. deep source and drain offset spacer 55, abutting the first gate structure 35, in which the first gate structure 35 includes the first metal gate electrode 16 atop a first high-k gate dielectric 17, wherein a portion 30 of the first high-k gate dielectric 17 is present beneath the spacer 55 abutting the first gate structure 35. As depicted in FIG. 8, the first gate structure 35 may also include a first polysilicon layer 14a atop the first metal gate electrode 16. In one embodiment, the portion 30 of the first high-k gate dielectric 17 that is present under the deep source and drain offset spacer 55 of the hot carrier memory FET i.e., programmable memory device 105, enhances the efficiency of trapping electrons in the deep source and drain offset spacer 55 due to the lower electron injection barrier of the high-k gate dielectric, i.e., first high-k gate dielectric 17, than the silicon oxide ($SiO_2$) or the silicon nitride ($Si_3N_4$) spacer 55. As discussed above, the dielectric material of the first high-k gate dielectric 17 may be composed of at least one of $HfO_2$, $ZrO_2$, $Al_2O_3$, $TiO_2$, $La_2O_3$, $SrTiO_3$, $LaAlO_3$, and $Y_2O_3$. In one example, in which the first high-k gate dielectric 17 of the programmable memory device 105 is composed of $HfO_2$, the barrier is approximately 1.5 eV, as compared to 3.5 eV for a similar device in which the gate dielectric is composed of $SiO_2$.

In one embodiment, the semiconductor device 110 includes a second gate structure 40 having a second metal gate electrode 21 atop a second high-k gate dielectric 22, wherein a sidewall $S_2$ of the second metal gate electrode 21 is aligned to an edge 23 of the second high-k gate dielectric 22. The semiconductor device 110 may be a logic device, which typically performs a logic function instead of a memory function by a memory device. In one embodiment, the above described semiconductor device 110, and method of forming thereof, produces a reduced hot carrier effect by not incorporating a high-k dielectric material beneath the offset spacer 55 that abuts the gate structure, i.e., the second gate structure 40, of the semiconductor device.

Figure 9:
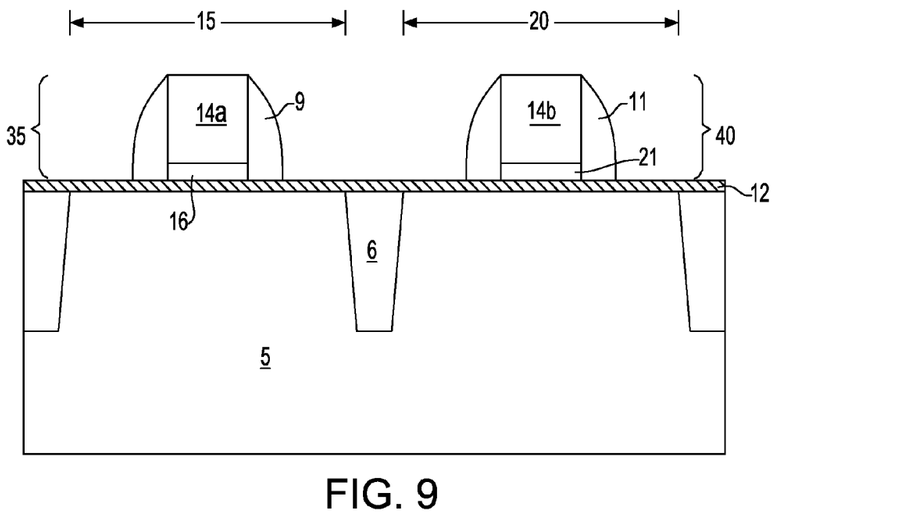
FIG. 9 depicts forming a first sacrificial spacer on the first metal gate electrode and a second sacrificial spacer on the second metal gate electrode.

FIGS. 9-12 depict another embodiment of a method for forming a memory device, as depicted in FIG. 1, wherein FIG. 9 depicts forming a first sacrificial spacer 9 on the first metal gate electrode 16 and a second sacrificial spacer 11 on the second metal gate electrode 21 of the structure depicted in FIG. 3. The description of forming the first sacrificial spacer 9 and the second sacrificial spacer 11 described above with reference to FIG. 5 is applicable to the embodiment of the invention depicted in FIG. 9.

Figure 10:
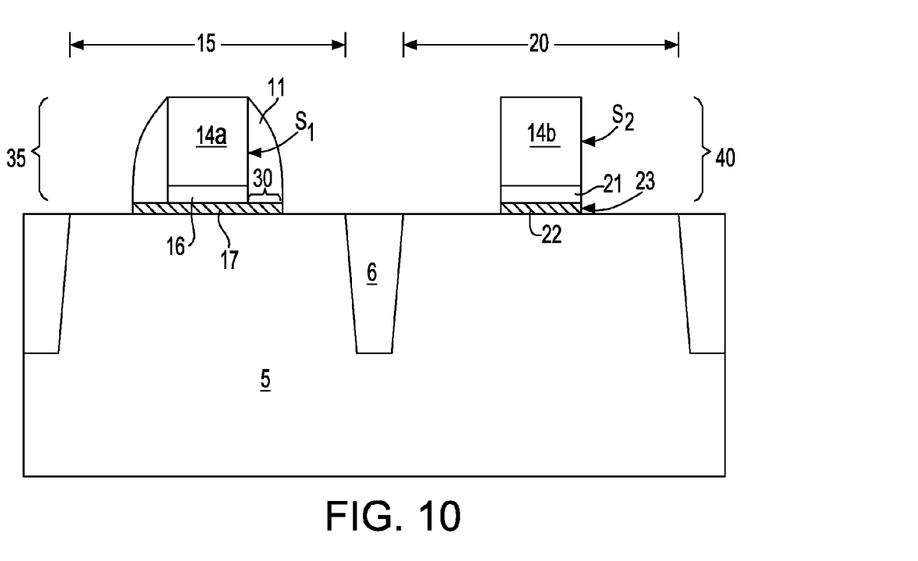
FIG. 10 depicts removing the second sacrificial spacer from the second metal gate electrode, and performing the etching of the remaining portion of the high-k gate dielectric layer to provide a first high-k gate dielectric having the portion that extends beyond the sidewall of the first metal gate electrode and the second high-k gate dielectric having the edge that is aligned to the sidewall of the second metal gate electrode.

FIG. 10 depicts removing the second sacrificial spacer from the second metal gate electrode 21, and etching an exposed portion of the high-k gate dielectric layer. Similar to the embodiment described above, the etch step provides a first gate structure 35 including a first high-k gate dielectric 17 having a portion 30 that extends beyond the sidewall $S_1$ of the first metal gate electrode 16 and a second gate structure 40 that includes the second high-k gate dielectric 22 having the edge 23 that is aligned to the sidewall $S_2$ of the second metal gate electrode 21.

Figure 11:
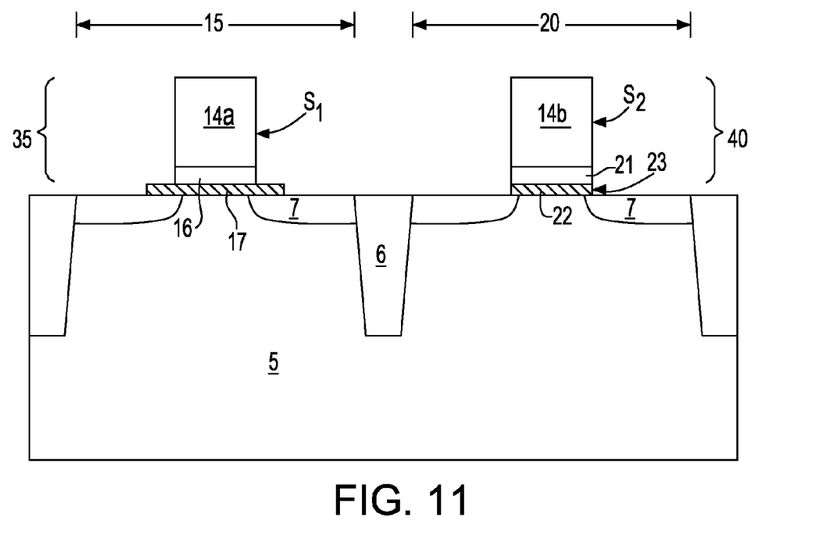
FIG. 11 is a side cross-sectional view depicting forming extension source and drain regions in the first portion and the second portion of the semiconductor substrate.
Figure 12:
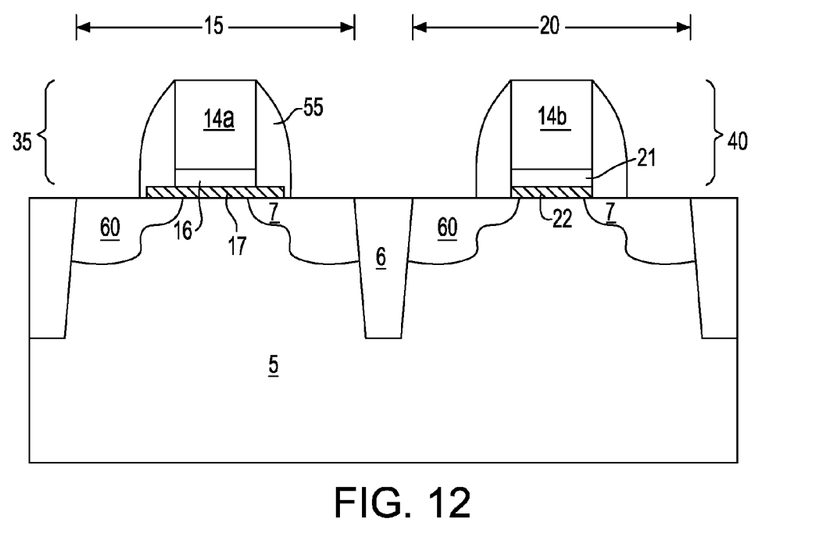
FIG. 12 is a side-cross sectional view depicting forming offset spacers abutting the first metal gate electrode and the second metal gate electrode; and forming deep source and drain regions in the first portion and the second portion of the semiconductor substrate.

Referring now to FIG. 11, in a next process step, the extension source and drain regions 7 are formed in the first portion 15 and the second portion 20 of the semiconductor substrate 5. Deep source and drain offset spacers 55 are then formed abutting the first metal gate electrode 16 and the second metal gate electrode 21, and deep source and drain regions 60 are formed in the first portion 15 and the second portion 20 of the semiconductor substrate 5, as depicted in FIG. 12.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a memory device comprising:
providing a semiconductor substrate comprising a first portion and a second portion;
forming a layered gate stack atop the semiconductor substrate, the layered gate stack comprising a high-k gate dielectric layer located atop the semiconductor substrate and a metal electrode layer atop the high-k gate dielectric layer;
patterning the metal electrode layer stopping on the high-k gate dielectric layer to provide a first metal gate electrode present in the first portion of the semiconductor substrate, and a second metal gate electrode present in the second portion of the semiconductor substrate;
forming at least one spacer on the first metal gate electrode atop a portion of the high-k gate dielectric layer, wherein a remaining portion of the high-k gate dielectric that is not beneath the first metal gate electrode, the second metal gate electrode, and the at least one spacer is exposed; and
etching the remaining portion of the high-k gate dielectric layer to provide a first high-k gate dielectric having a portion that extends beyond a sidewall of the first metal gate electrode and a second high-k gate dielectric having an edge that is aligned to a sidewall of the second metal gate electrode,
wherein forming the at least one spacer comprises depositing a dielectric material, and anisotropically etching the dielectric material such that the width of the at least one spacer defines the portion of the first high-k gate dielectric that extends beyond the sidewall of the first metal gate electrode.

2. The method of claim 1, wherein the semiconductor substrate is a semiconductor on insulator (SOI) substrate or is a bulk semiconductor substrate.

3. The method of claim 1, wherein the high-k gate dielectric layer is deposited using at least one deposition process selected from the group consisting of chemical vapor deposition (CVD), atomic layer CVD (ALCVD), pulsed CVD, plasma assisted CVD, sputtering, and chemical solution deposition.

4. The method of claim 1, wherein the first portion of the semiconductor substrate is separated from the second portion of the semiconductor substrate by an isolation region.

5. The method of claim 4, wherein the isolation region is a shallow trench isolation region.

6. The method of claim 1, wherein the forming of the layered gate stack further comprises a polysilicon layer atop the metal electrode layer.

7. The method of claim 1 further comprising forming extension source and drain regions in the first portion and the second portion of the semiconductor substrate following the formation of the first metal gate electrode and the second metal gate electrode.

8. The method of claim 7, wherein the forming of the at least one spacer on the first metal gate electrode atop the portion of the high-k gate dielectric layer comprises forming a first sacrificial spacer on the first metal gate electrode and a second sacrificial spacer on the second metal gate electrode; and removing the second sacrificial spacer from the second metal gate electrode, wherein the first sacrificial spacer on the first metal gate electrode provides the at least one spacer.

9. The method of claim 8, further comprising removing the first sacrificial spacer from the first metal gate electrode.

10. The method of claim 9, further comprising forming offset spacers abutting the first metal gate electrode and the second metal gate electrode and forming source and drain regions in the first portion and the second portion of the semiconductor substrate.

11. The method of claim 8, further comprising forming offset spacers abutting the first metal gate electrode and the second metal gate electrode; and forming source and drain regions in the first portion and the second portion of the semiconductor substrate.

12. The method of claim 1, wherein the portion of the high-k gate dielectric layer that extends beyond the sidewall of the first metal gate electrode ranges from 2 nm to 40 nm.

13. The method of claim 1, wherein the portion of the high-k gate dielectric layer that extends beyond the sidewall of the first metal gate electrode ranges from 5 nm to 20 nm.

14. The method of claim 1, wherein at least one of the first high-k gate dielectric and the second high-k gate dielectric is selected from the group consisting of $HfO_2$, $ZrO_2$, $Al_2O_3$, $TiO_2$, $La_2O_3$, $SrTiO_3$, $LaAlO_3$, $Y_2O_3$ and combinations thereof.

15. The method of claim 1, wherein the metal electrode layer has a thickness ranging from 5 nm to 50 nm.

16. The method of claim 1, wherein the metal electrode layer is deposited using chemical vapor deposition, plating, spurting or a combination thereof.

17. The method of claim 1, wherein the memory device including the first metal gate electrode is a hot carrier memory field effect transistor (FET).

18. The method of claim 17, wherein the electron injection barrier of the hot carrier memory field effect transistor having the first high-k gate dielectric is equal to 1.5 eV.

19. The method of claim 18, wherein the second metal gate electrode is a component of a logic device.

* * * * *